United States Patent
Zindler et al.

(10) Patent No.: US 9,967,963 B2
(45) Date of Patent: May 8, 2018

(54) SYSTEM AND METHOD FOR CONTROLLING PLASMA MAGNETIC FIELD

(71) Applicant: General Fusion Inc., Burnaby (CA)

(72) Inventors: Ryan Walter Zindler, Surrey (CA); Jonathan Damian Fraser, Vancouver (CA)

(73) Assignee: General Fusion Inc., Burnaby, British Columbia (CA)

( * ) Notice: Subject to any disclaimer, the term of this patent is extended or adjusted under 35 U.S.C. 154(b) by 0 days. days.

(21) Appl. No.: 15/502,902

(22) PCT Filed: Aug. 18, 2015

(86) PCT No.: PCT/CA2015/050784
§ 371 (c)(1),
(2) Date: Feb. 9, 2017

(87) PCT Pub. No.: WO2016/026040
PCT Pub. Date: Feb. 25, 2016

(65) Prior Publication Data
US 2017/0303380 A1    Oct. 19, 2017

Related U.S. Application Data

(60) Provisional application No. 62/039,191, filed on Aug. 19, 2014.

(51) Int. Cl.
*H05H 1/04* (2006.01)
*H05H 1/00* (2006.01)
(Continued)

(52) U.S. Cl.
CPC ........... *H05H 1/04* (2013.01); *G01R 19/0061* (2013.01); *G01R 33/028* (2013.01); *H05H 1/0087* (2013.01)

(58) Field of Classification Search
None
See application file for complete search history.

(56) References Cited

U.S. PATENT DOCUMENTS 2,992,345 A    7/1961    Hansen
3,194,739 A    7/1965    Kerst et al.
(Continued)

FOREIGN PATENT DOCUMENTS

CA    2750441       4/2012
EP    2460160 B1    6/2013
(Continued)

OTHER PUBLICATIONS

B. Bauer et al., "Magnetized High Energy Density Laboratory Plasmas," http://fusionenergy.lanl.gov/mhedlp-wp.pdf, Apr. 20, 2007, in 24 pages.
(Continued)

*Primary Examiner* — Douglas W Owens
*Assistant Examiner* — Srinivas Sathiraju
(74) *Attorney, Agent, or Firm* — Knobbe, Martens, Olson & Bear, LLP

(57) ABSTRACT

Examples of a system for generating and confining a compact toroid are disclosed. The system comprises a plasma generator for generating magnetized plasma, a flux conserver for receiving the compact toroid, a power source for providing current pulse and a controller for actively controlling a current profile of the pulse to keep plasma's q-profile within pre-determined range. Examples of methods of controlling a magnetic lifetime of a magnetized plasma by controlling a current profile of the current pulse are disclosed.

10 Claims, 7 Drawing Sheets

(51) Int. Cl.
*G01R 19/00* (2006.01)
*G01R 33/028* (2006.01)

(56) References Cited

U.S. PATENT DOCUMENTS

| | | | |
|---|---|---|---|
| 3,346,458 A | 10/1967 | Schmidt | |
| 3,579,028 A | 5/1971 | Paine | |
| 3,778,343 A | 12/1973 | Coppi et al. | |
| 4,023,065 A | 5/1977 | Koloc | |
| 4,068,147 A | 1/1978 | Wells | |
| 4,129,772 A | 12/1978 | Navratil et al. | |
| 4,228,380 A | 10/1980 | Wells | |
| 4,290,848 A | 9/1981 | Sudan | |
| 4,292,568 A | 9/1981 | Wells et al. | |
| 4,735,762 A | 4/1988 | Lasche | |
| 4,790,735 A | 12/1988 | Mayer | |
| 5,015,432 A | 5/1991 | Koloc | |
| 5,041,760 A | 8/1991 | Koloc | |
| 5,397,961 A | 3/1995 | Ayers et al. | |
| 5,429,030 A | 7/1995 | Tidman | |
| 5,811,944 A | 9/1998 | Sampayan et al. | |
| 5,821,705 A | 10/1998 | Sampayan et al. | |
| 5,923,716 A | 7/1999 | Meacham | |
| 6,396,213 B1 | 5/2002 | Koloc | |
| 6,477,216 B2 | 11/2002 | Koloc | |
| 6,593,539 B1 | 7/2003 | Miley et al. | |
| 6,611,106 B2 | 8/2003 | Monkhorst et al. | |
| 6,628,740 B2 | 9/2003 | Monkhorst et al. | |
| 6,660,997 B2 | 12/2003 | Laberge et al. | |
| 6,664,740 B2 | 12/2003 | Rostoker et al. | |
| 6,680,480 B2 | 1/2004 | Schoen | |
| 6,850,011 B2 | 2/2005 | Monkhorst et al. | |
| 6,852,942 B2 | 2/2005 | Monkhorst et al. | |
| 6,853,141 B2* | 2/2005 | Hoffman | H01J 37/32091 315/111.21 |
| 6,888,907 B2 | 5/2005 | Monkhorst et al. | |
| 6,891,911 B2 | 5/2005 | Rostoker et al. | |
| 6,894,446 B2 | 5/2005 | Monkhorst et al. | |
| 6,995,515 B2 | 2/2006 | Rostoker et al. | |
| 7,002,148 B2 | 2/2006 | Monkhorst et al. | |
| 7,015,646 B2 | 3/2006 | Rostoker et al. | |
| 7,026,763 B2 | 4/2006 | Rostoker et al. | |
| 7,119,491 B2 | 10/2006 | Rostoker et al. | |
| 7,126,284 B2 | 10/2006 | Rostoker et al. | |
| 7,129,656 B2 | 10/2006 | Rostoker et al. | |
| 7,173,385 B2 | 2/2007 | Caporaso et al. | |
| 7,180,242 B2 | 2/2007 | Rostoker et al. | |
| 7,230,201 B1 | 6/2007 | Miley et al. | |
| 7,232,985 B2 | 6/2007 | Monkhorst et al. | |
| 7,391,160 B2 | 6/2008 | Monkhorst et al. | |
| 7,439,678 B2 | 10/2008 | Rostoker et al. | |
| 7,459,654 B2 | 12/2008 | Monkhorst et al. | |
| 7,477,718 B2 | 1/2009 | Rostoker et al. | |
| 7,486,758 B1 | 2/2009 | Turchi | |
| 7,569,995 B2 | 8/2009 | Rostoker et al. | |
| 7,576,499 B2 | 8/2009 | Caporaso et al. | |
| 7,613,271 B2 | 11/2009 | Rostoker et al. | |
| 7,679,025 B1 | 3/2010 | Krishnan et al. | |
| 7,719,199 B2 | 5/2010 | Monkhorst et al. | |
| 7,831,008 B2 | 11/2010 | Perkins et al. | |
| 7,955,986 B2* | 6/2011 | Hoffman | H01J 37/32091 118/723 E |
| 8,031,824 B2 | 10/2011 | Bystritskii et al. | |
| 8,537,958 B2 | 9/2013 | Laberge et al. | |
| 8,617,351 B2* | 12/2013 | Hoffman | H01J 37/32091 156/345.46 |
| 8,887,618 B2 | 11/2014 | McIlwraith et al. | |
| 8,891,719 B2 | 11/2014 | Howard et al. | |
| 8,994,271 B2 | 3/2015 | Kindel et al. | |
| 9,267,515 B2* | 2/2016 | Suponitsky | F15D 1/08 |
| 9,271,383 B2 | 2/2016 | Howard et al. | |
| 9,424,955 B2 | 8/2016 | Laberge et al. | |
| 9,463,478 B2 | 10/2016 | Suponitsky et al. | |
| 2003/0024476 A1 | 2/2003 | Rostoker et al. | |
| 2004/0079287 A1 | 4/2004 | Smith et al. | |

| | | | |
|---|---|---|---|
| 2005/0001556 A1* | 1/2005 | Hoffman | H01J 37/32091 315/111.91 |
| 2006/0039519 A1 | 2/2006 | Rostoker et al. | |
| 2006/0076897 A1 | 4/2006 | Rostoker et al. | |
| 2006/0198483 A1 | 9/2006 | Laberge | |
| 2006/0198486 A1 | 9/2006 | Laberge et al. | |
| 2006/0198487 A1 | 9/2006 | Laberge | |
| 2006/0254520 A1 | 11/2006 | Rostoker et al. | |
| 2006/0267504 A1 | 11/2006 | VanDrie et al. | |
| 2007/0058770 A1 | 3/2007 | Fissenko et al. | |
| 2007/0096659 A1 | 5/2007 | Monkhorst et al. | |
| 2007/0145018 A1 | 6/2007 | Smith et al. | |
| 2007/0158534 A1 | 7/2007 | Monkhorst et al. | |
| 2007/0172017 A1 | 7/2007 | Rostoker et al. | |
| 2008/0205573 A1 | 8/2008 | Larson | |
| 2008/0251502 A1 | 10/2008 | Monkhorst et al. | |
| 2009/0152094 A1 | 6/2009 | Fissenko et al. | |
| 2009/0213975 A1 | 8/2009 | Sturt | |
| 2010/0067639 A1 | 3/2010 | Sturt | |
| 2010/0163130 A1 | 7/2010 | Laberge et al. | |
| 2010/0206847 A1 | 8/2010 | Chen et al. | |
| 2010/0215136 A1 | 8/2010 | Rusnak et al. | |
| 2011/0019789 A1 | 1/2011 | Rostoker et al. | |
| 2011/0026657 A1 | 2/2011 | Laberge et al. | |
| 2011/0026658 A1 | 2/2011 | Howard et al. | |
| 2011/0158369 A1 | 6/2011 | Larson | |
| 2011/0243292 A1 | 10/2011 | Howard et al. | |
| 2011/0293056 A1 | 12/2011 | Slough | |
| 2012/0014491 A1 | 1/2012 | Deeth | |
| 2012/0031070 A1 | 2/2012 | Slough et al. | |
| 2012/0085920 A1 | 4/2012 | Guethlein | |
| 2012/0155591 A1 | 6/2012 | Freeze | |
| 2013/0270747 A1* | 10/2013 | Tranter | B29C 51/14 264/480 |
| 2014/0165552 A1* | 6/2014 | McIlwraith | G10K 15/04 60/532 |
| 2014/0247913 A1 | 9/2014 | Laberge et al. | |
| 2015/0021339 A1 | 1/2015 | Felts et al. | |
| 2015/0152899 A1 | 6/2015 | McIlwraith et al. | |
| 2015/0216028 A1 | 7/2015 | Laberge et al. | |
| 2016/0129142 A1 | 5/2016 | Nettesheim | |
| 2016/0314855 A1 | 10/2016 | Laberge et al. | |

FOREIGN PATENT DOCUMENTS

| | | |
|---|---|---|
| JP | S55-501066 | 12/1980 |
| WO | WO 80/00045 | 1/1980 |
| WO | WO 93/23587 | 11/1993 |
| WO | WO 2011/014577 A1 | 2/2011 |
| WO | WO 2011/084903 A1 | 7/2011 |
| WO | WO 2011/154172 A1 | 12/2011 |
| WO | WO 2012/113057 A1 | 8/2012 |
| WO | WO 2014/032186 A1 | 3/2014 |
| WO | WO 2016/026040 A1 | 2/2016 |

OTHER PUBLICATIONS

Bellan, P.M., "Spheromaks: A practical application of magnetohydrodynamic dynamos and plasma self-organization," Imperial College Press, 2000, pp. 1-9, 268-275.

Browning, P.K. et al., "Power Flow in a Gun-Injected Spheromak Plasma", The American Physical Society, Physical Review Letters, vol. 68, No. 11, Mar. 16, 1992, pp. 1718-1721.

J. H. Degnan et al, "Compression of compact toroids in conical-coaxial geometry", Fusion Technology, Mar. 1995, vol. 27, Issue 2, pp. 107-114.

J. H. Degnan et al., "Compact toroid formation, compression, and acceleration", Phys. Fluids B, Aug. 1993, vol. 5 , Issue 8, pp. 2938-2958.

M. Delage et al., "Progress Towards Acoustic Magnetized Target Fusion: An Overview of the R&D Program at General Fusion", 33rd Ann. Conf. Can. Nuc. Soc., Jun. 2012, in 13 pages.

R.C. Duck et al., "Structure of the n = 1 responsible for relaxation and current drive during sustainment of the SPHEX spheromak", Plasma Physics and Controlled Fusion, vol. 39, No. 5, May 1997, 715-736.

(56) References Cited

OTHER PUBLICATIONS

J. Eddleman et al., "Final Report on the LLNL Compact Torus Acceleration Project," Lawrence Livermore National Laboratory, UCRL-ID-120238, Mar. 19, 1995, in 62 pages.
J. D. Graham et. al., "Shiva Star—MARAUDER Compact Torus System," Digest of Technical Papers, 8th IEEE International Pulsed Power Conference, Jun. 1991 pp. 990-993.
T.K. Fowler, "Pulsed Spheromak Fusion Reactors", Comments on Plasma Physics & Controlled Fusion, Comments on Modern Physics, vol. 1(3), Part C, Jun. 1999, pp. 83-98.
T.K. Fowler, "Pulsed Spheromak Reactor With Adiabatic Compression", Lawrence Livermore National Laboratory, Mar. 29, 1999, in 13 pages.
T.K. Fowler, "Stability of Spheromaks Compressed by Liquid Walls", Lawrence Livermore National Laboratory, Aug. 17, 1999, in 9 pages.
J. H. Hammer et al, "Experimental demonstration of acceleration and focusing of magnetically confined plasma rings", Physical Review Letters, Dec. 19, 1988, vol. 61, Issue 25, pp. 2843-2846.
C. W. Hartman et al, "Acceleration of Spheromak Toruses, Experimental results and fusion applications", OSTI ID: 5240480; DE90005312 , Proceedings of 11th US/Japan workshop on field-reversed configurations and compact toroids; Nov. 7-9, 1989, Dec. 1, 1989, Los Alamos, NM, USA.
C.W. Hartman et al., "Acceleration of Compact Toruses and Fusion Applications", Workshop on Physics of Alternative Magnetic Confinement Schemes, UCRL-JC-106121 Preprint, Oct. 11, 1990, Issue UCRL-JC-106121 Prepr, Varenna, Italy.
C. W. Hartman et al., "Acceleration of Compact Toroid Plasma Rings for Fusion Applications," Lawrence Livermore National Laboratory, UCRL-98504, Prepared for Submittal to IAEA 12th International Conference on Plasma Physics and Controlled Nuclear Fusion Research in Nice, France, Oct. 12-19, 1988, in 16 pages.
C.W. Hartman et al., "Acceleration of Compact Torus Plasma Rings in a Coaxial Rail-Gun", 7th Symposium on Compact Toroid Research, Santa Fe, New Mexico, May 21-23, 1985, in 6 pages.
D.N. Hill et al., "Field and Current Amplification in the SSPX Spheromak", 19th IAEA Fusion Energy Conference, Oct. 8, 2002, in 8 pages.
S. Howard et al., "Development of merged compact toroids for use as a magnetized target fusion plasma", Journal of Fusion Energy, Nov. 11, 2008, vol. 28, No. 2, pp. 156-161, available Jun. 2008.
S.C. Hsu et al, "On the Jets, Kinks, and Spheromaks Formed by a Planar Magnetized Coaxial Gun", California Institute of Technology, Pasadena, CA 91125, Feb. 2, 2008, pp. 1-16.
R.C. Kirkpatrick, "Assessment of the Acoustically Driven MTF Experiments being conducted by Dr. Michel Laberge of General Fusion, Inc.," May 2007, in 3 pages.
Thomas W. Kornack, "Magnetic Reconnection Studies on SSX", Swarthmore College Department of Physics and Astronomy, Swarthmore, PA, USA, Jun. 10, 1998, pp. 2-56.
Michel Laberge, "Acoustic Wave Driven MTF Fusion Reactor," Mar. 2007, in 20 pages.
Michel Laberge, "An Acoustically Driven Magnetized Target Fusion Reactor," Journal of Fusion Energy, vol. 27, Nos. 1-2, Jul. 11, 2007, pp. 65-68.
Michel Laberge, "Evidence of Fusion Products in Acoustically Driven MTF," Mar. 2007, in 41 pages.
Michel Laberge, "Experimental Results for an Acoustic Driver for MTF," Journal of Fusion Energy, Jun. 2009, vol. 28, Nos. 2, pp. 179-182, available Jun. 2008.
D. Liu et al., "Bench Test and Preliminary Results of Vertical Compact Torus Injection Experiments on the STOR-M Tokamak", Nuclear Fusion 46 (006), Dec. 16, 2005, pp. 104-109.
CH. Mangeant et al., "Syrinx Project: Compact Pulse-Current Generators Devoted to Material Study Under Isentropic Compression Loading", in Pulsed Power Plasma Science, IEEE, Jun. 2001, in 4 pages.
T. E. Markusic et al., "Visualization of Current Sheet Canting in a Pulsed Plasma Accelerator", IEPC-99-206, 26th International Electric Propulsion Conference in Kitakyushu, Japan, Oct. 17-21, 1999, in 8 pages.
H. S. McLean et al, "Design and operation of a passively switched repetitive compact toroid plasma accelerator", Fusion Technology, May 1998, vol. 33, pp. 252-272.
D.J. Meeker et al., "A High Efficiency I.C.F. Driver Employing Magnetically Confined Plasma Rings", Lawrence Livermore National Laboratory, Sixth Topical Meeting on the Technology of Fusion Energy, San Francisco, California, Mar. 3-7, 1985, in 8 pages.
R. L. Miller and R. A. Krakowski, "Assessment of the slowly-imploding liner (LINUS) fusion reactor concept", Los Alamos Scientific Laboratory, Oct. 1980, Issue Rept. No. LA-UR-80-3, Los Alamos, NM, USA, in 10 pages.
J. Miyazawa et al., "Design of Spheromak Injector Using Conical Accelerator for Large Helical Device", Fusion Engineering and Design 54 (2001), pp. 1-12.
R. W. Moir et al., "HYLIFE-II: An approach to a long-lived, first-wall component for inertial fusion power plants", Lawrence Livermore National Lab, Aug. 1, 1994, vol. Report No. UCRL-J, Issue CONF-940933-46, in 15 pages.
G. Olynyk et al., "Development of a Compact Toroid Fuelling System for ITER", Nuclear Fusion, vol. 48, No. 9, Sep. 2008, in 11 pages.
G. M. Olynyk, "Design and evaluation of a repetitive-fire compact toroid fuelling system for ITER," thesis submitted to the Department of Physics, Queen's University, Ontario, Canada, Mar. 2007, in 48 pages.
R. E. Peterkin, Jr. , "Direct electromagnetic acceleration of a compact toroid to high density and high speed", Physical Review Letters, Apr. 17, 1995, vol. 74, Issue 16, pp. 3165-3168.
R. Raman et al., "Compact Toroid Fueling for ITER", Fusion Engineering and Design 39-40 (1998), pp. 977-985.
R. Raman et al., "Experimental Demonstration of Nondisruptive, Central Fueling of a Tokamak by Compact Toroid Injection", Phys. Rev. Lett., 1994, pp. 3101-3105.
R. Raman et al., "Experimental Demonstration of Tokamak Fueling by Compact Toroid Injection", Nuclear Fusion, vol. 37, 1997, pp. 967-972.
R. Raman et al., "ITER Task D315 (1997): Conceptual Design Definition of a Compact Toroid Injection System", CFFTP G-9729, Sep. 1997, in 24 pages.
Roger Raman et al., "Design of the Compact Toroid Fueler Tokamak de Varennes", Fusion Technology, A Journal of the Nuclear Society, vol. 24, No. 3, Nov. 1993, pp. 239-250.
Y.C.F. Thio et al., "Magnetized Target Fusion Driven by Plasma Liners", 2002, in 3 pages.
Y. C. F.Thio et al., "Magnetized Target Fusion in a Spheroidal Geometry With Standoff Drivers," Fusion Technology 20, 1991, in 22 pages.
Y. C. F.Thio et al.,"Pulsed Electromagnetic Acceleration of Plasmas," 38th AIAA/ASME/SAE/ASEE Joint Propulsion Conference & Exhibit, Jul. 7-10, 2002, in 9 pages.
M.T. Tobin et al, "The Compact Torus Accelerator, A Driver for ICF", UCRL-93901-R1, Lawrence Livermore National Laboratory, Jul. 31, 1986, in 9 pages.
F. D. Witherspoon et al., "A contoured gap coaxial plasma gun with injected plasma armature," American Institute of Physics, Review of Scientific Instruments 80, 083506, Aug. 2009, in 15 pages.
F. D. Witherspoon et al., "Pulsed Injector Development for Dense Plasma Jets," Research Funded by the DOE Office of Fusion Energy Science through Grants DE-FG02-04ER83978, DE-FG02-05ER54810, DE-FG02-05ER84189, Feb. 2007, in 32 pages.
G.A. Wurden et al., "FRC Plasma Studies on the FRX-L Plasma Injector for MTF", Paper IC/P6-53, 50th IAEA Fusion Energy Conference, Nov. 2004, in 7 pages.
G.A. Wurden et al., "High Pressure Field Reversed Configuration Plasmas in FRX-L for Magnetized Target Fusion", Jan. 26, 2006, in 2 pages.

(56) References Cited

OTHER PUBLICATIONS

G.A. Wurden et al., "Magnetized Target Fusion: A Burning FRC Plasma in an Imploded Metal Can", J. Plasma Fusion Res. Series, vol. 2, Aug. 1999, pp. 238-241.
G.A. Wurden et al., "Progress on the FRX-L FRC Plasma Injector at LANL for Magnetized Target Fusion", Mar. 1, 2002, pp. 1-6.
G.A. Wurden, Letter to Dr. Laberge, May 2007, in 1 page.
C. Xiao et al., "Improved Confinement Induced by Tangential Injection of Compact Torus Into the Saskatchewan Torus-Modified (STOR-M) Tokamak", Phys. Plasmas, vol. 11, No. 8, Aug. 2004, pp. 4041-4049.
V. Suponitsky et al., "Richtmyer-Meshkov instability of a liquid-gas interface driven by a cylindrical imploding wave", Computers & Fluids, vol. 89, Jan. 20, 2014, in 19 pages.
V. Suponitsky et al., "An Overview of Computational Results at General Fusion Inc. with Focus on Hydrodynamics", Proceedings of CFD Society of Canada Conference, May 2012, in 9 pages.
V. Suponitsky et al., "On the Collapse of a Gas Cavity by an Imploding Molten Lead Shell and Richtmyer-Meshkov Instability", Proceedings of the 20th Annual Conference of the CFD Society of Canada, Canmore, Alberta, Canada, May 9-12, 2012, in 8 pages.
Kiuttu, G.F., et al., "Acceleration and compression of compact toroid plasmas," 1994 10th International Conference on High-Power Particle Beams, IET, vol. 1, pp. 150-158, Jun. 1994.
Logan, B.G., et al., "Compact Torus Accelerator Driven Inertial Confinement Fusion Power Plant HYLIFE-CT," Lawrence Livermore National Laboratory, UCRL-TR-211025, Apr. 1, 2005, in 85 pages.
N. M. Schnurr et. al., "An Analytical Investigation of the Impingement of Jets on Curved Deflectors", AIAA Journal, vol. 10, No. 11, Nov. 1972, in 41 pages.
J.E.Barton et al., "Closed-loop control of the safety factor profile in the TCV Tokamak", 53rd IEEE Conference on Decision and Control, Dec. 15-17, 2014, Los Angeles, California, pp. 5660-5665.
C.E.Kessel et al., "Simulations and Experiments on Modifying the q-Profile for Advanced Tokamak Discharges on Alcator C-Mod", APS Division of Plasma Physics, Nov. 2007, in 40 pages.
C.E.Kessel, "Control of plasma profiles in a Tokamak", NSF Workshop on Mathematical Modeling and Control of Plasma in Magnetic Fusion, General Atomics, May 11-12, 2006, in 20 pages.
J.T.Slough et al., "Multimegawatt solid state rf driver for generating rotating magnetic fields", Review of Scientific Instruments, vol. 71, No. 8, Aug. 2000, pp. 3210-3213.
F.Crisanti et al., "Active control of the plasma current profile on JET Experiments", 30th Conference on Contr. Fusion and Plasma Phys., St. Petersburg, Jul. 7-11, 2003, ECA vol. 27A, P-2.88, in 4 pages.
D.M.Willett et al., "The internal magnetic structure and current drive in the SPHEX spheromak", Plasma Phys. Control. Fusion, vol. 41, Mar. 1999, pp. 595-612.
Slough, John, "Multi-Megawatt Propulsion Based on a Compact Toroid Thruster", $29^{th}$ International Electric Propulsion Conference, Nov. 4, 2005, in 15 pages.
Richardson et al., "Status of Progress Towards Acoustic Magnetized Target Fusion at General Fusion", $34^{th}$ Annual Conference on the Canadian Nuclear Society, Jun. 12, 2013, in 15 pages.
International Search Report and Written Opinion from corresponding International Patent Application No. PCT/CA2015/050784, dated Nov. 3, 2015, in 12 pages.
Argomedo, F. B., et al., "Model-based Control of the Magnetic Flux Profile in a Tokamak Plasma," in 49th IEEE Conference on Decision and Control, Dec. 2010, in 6 pages.
Moreau, D., "Plasma Shape, Profiles and Flux Control for High-Bootstrap Steady State Tokamaks," European Fusion Development Agreement, IEA W59 Shape and Aspect Ratio Optimization for High Beta, Steady-State Tokamaks, San Diego, Feb. 2005, in 30 pages.
Witrant, E., et al., "A Simplified Plasma Current Profile Model for Tokamak Control," Jan. 2007, in 7 pages.

* cited by examiner

SYSTEM AND METHOD FOR CONTROLLING PLASMA MAGNETIC FIELD

TECHNICAL FIELD

The present disclosure relates generally to a system and method for controlling a decay time of a plasma magnetic field and particularly to a system and method for controlling plasma stability by controlling plasma magnetic field.

BACKGROUND

Unless otherwise indicated herein, the materials described in this section are not prior art to the claims in this application and are not admitted to be prior art by inclusion in this section.

Plasma is a state of matter similar to gas in which at least part of the particles are ionized. The presence of charged particles (e.g. positive ions and negative electrons) makes plasma electrically conductive. Plasma with a magnetic field strong enough to influence the motion of the charged particles is called magnetized plasma. A plasma torus is a self-sustained magnetized plasma shaped into a toroidal configuration (donut shape), with linked poloidal and toroidal (in some cases) closed magnetic field lines. Toroidal magnetic field comprises magnetic field lines that go parallel to a magnetic axis of the plasma torus. The toroidal field is generated by a current flowing in poloidal direction around the plasma's magnetic axis. Poloidal magnetic field comprises magnetic field lines that go around the magnetic axis of the plasma torus and is generated by a current flowing in toroidal direction, parallel to the magnetic axis. As a magnetic field line runs many turns around the plasma in the toroidal and poloidal direction, it defines a "flux surface" at a constant radius from the plasma's magnetic axis. The extent of linkage of the poloidal and toroidal magnetic fluxes defines a helicity of the plasma torus. Plasma torus contained in a simply connected volume is called a compact toroid (CT). The CT configuration can include, for example: a spheromak configuration that exists close to a stable magnetohydrodynamic equilibrium with an internal magnetic field having both toroidal and poloidal components; or a Field Reversed Configuration (FRC), which also has a toroidal magnetic topology, but can be more elongated in the axial direction with an outer surface being similar to a prolate ellipsoid, and which has primarily a poloidal magnetic field, with no toroidal magnetic field component. CT plasmas can be formed in a range of magnetic configurations, including ones that exist in states that are in between spheromak and FRC states. Other configurations of magnetized plasma include tokamaks, reversed field pinches (RFP) and stellarators, all of which use external coils to provide toroidal magnetic field at the wall of a plasma confinement chamber (flux conserving chamber). In contrast, spheromaks and FRCs do not have external coils to provide plasma's toroidal field and the magnetic fields are generated by the currents flowing in the plasma.

Controlled thermonuclear fusion is based on the fusion of light nuclei present in the plasma to form a heavier nucleus. Plasma needs to confine nuclei for a sufficiently long time to allow enough of such nuclei to fuse. Therefore, stabilization and maintaining the plasma in a stable configuration is very important for any fusion system and fusion scheme. In case of magnetized plasma configurations, plasma magnetic field (poloidal and/or toroidal field component) is a key plasma property related to plasma stability and plasma performance.

SUMMARY

In one aspect, a system for controlling the decay of a plasma magnetic field is provided. The system comprises a controller comprising an input unit, a processing unit and an output unit. A plurality of measuring probes positioned at various radial, axial and angular positions are configured to provide signals of at least one parameter of the plasma to the input unit of the controller. A power source is provided in communication with the output unit of the controller. The power source is configured to provide one or more additional, axial, current pulses to the system to increase a toroidal field of the plasma. The power source has a means for adjusting an inductance-to-resistance (L/R) time constant to adjust a current decay time of the current pulses. The controller has a memory that comprises a program code executable by the processing unit to process the signals obtained from the plurality of measuring probes to identify an irregularity in the signals obtained from the probes and triggers the power source to provide the axial current pulse when an irregularity is detected in a signal from at least one of the probe. The L/R time constant of the power system is adjusted to be shorter than a shortest decay time of a poloidal field of the plasma.

In another aspect the controller further comprises program code executable by the processing unit to calculate a ratio of the toroidal to poloidal magnetic field of the plasma and compare the calculated ratio to an empirically derived lower threshold value. The controller triggers the power source to provide the additional, axial, current pulse when the calculated ratio is below the lower threshold value. The controller further comprises program code executable by the processing unit to maintain the magnetic field ratio between the lower threshold value and an upper threshold value.

In one aspect, the controller further comprises program code executable by the processing unit to detect oscillations in the signals obtained from the plurality of probes. The additional, axial, current pulse is triggered when the oscillations are detected in the signal obtained from at least one of the probes.

The controller further comprises program code executable by the processing unit to calculate an instability mode of the plasma based on a phase of the oscillations in the signals obtained from the probes positioned at different angular positions. The program code is further executable to adjust a timing of the triggering of the axial current pulse based on the calculated instability mode.

In another aspect, a method of controlling a decay time of a plasma magnetic field is provided. The method comprises adjusting an inductance to resistance (L/R) time constant to be shorter than a shortest decay time of a poloidal field of the magnetized plasma; measuring one or more parameters of the plasma by a plurality of probes positioned at various radial, axial and angular positions in a wall of a flux conserving chamber to detect the parameters at various angular and radial positions from a magnetic axis of the plasma; processing signals obtained from the plurality of probes; detecting an irregularity in the obtained signals and triggering the power source to provide an additional, axial, current pulse based on a detected irregularity in a signal of at least one probe.

In addition to the aspects and embodiments described above, further aspects and embodiments will become apparent by reference to the drawings and study of the following detailed description.

BRIEF DESCRIPTION OF THE DRAWINGS

Throughout the drawings, reference numbers may be re-used to indicate correspondence between referenced elements. The drawings are provided to illustrate example embodiments described herein and are not intended to limit the scope of the disclosure. Sizes and relative positions of elements in the drawings are not necessarily drawn to scale. For example, the shapes of various elements and angles are not drawn to scale, and some of these elements are arbitrarily enlarged and positioned to improve drawing legibility.

DETAILED DESCRIPTION OF SPECIFIC EMBODIMENTS

Figure 1:
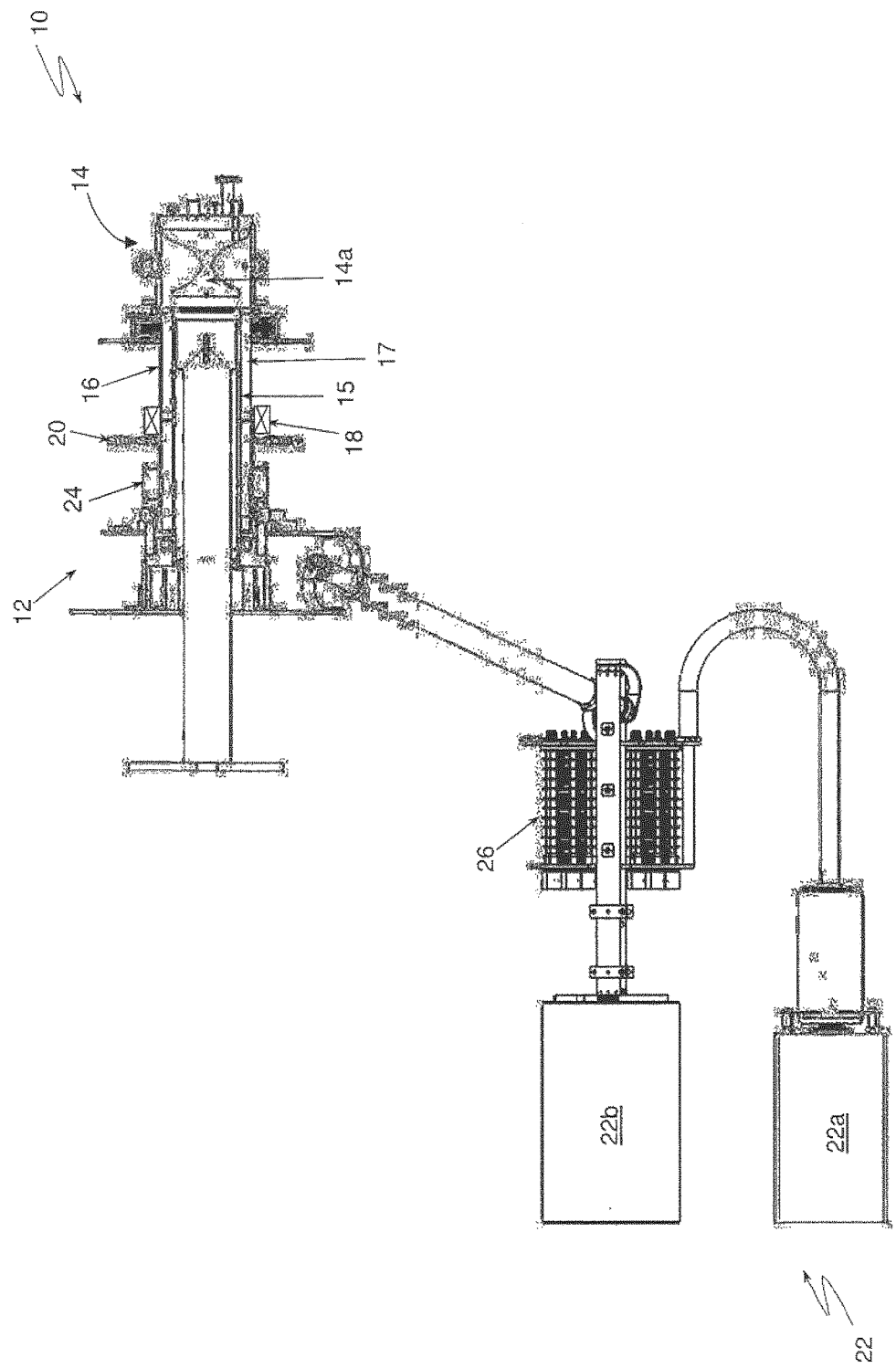
FIG. 1 is a cross-sectional side view of an example of a system for generating and confining plasma comprising a plasma generator, a flux conserver and a power supply.

As mentioned herein before, the majority of the magnetic field in a magnetized plasma is created by currents flowing in the plasma itself and/or in the wall of the flux conserving chamber. The magnetic field in the magnetized plasma confines plasma energy by suppressing the transit of heat and particles from the core of the plasma to its edge. Since the path of charged particles in a magnetic field is confined to spirals that travel along field lines great care should be taken to ensure that the magnetic field lines run in the toroidal and poloidal direction but not along the radial direction to avoid a direct route from the core to the edge of the plasma. The ratio of toroidal to poloidal field on a flux surface can best be described by tracing out a field line and counting the number of toroidal turns it completes before completing one poloidal turn and this number is called a safety factor or q-factor. "q-profile" as used herein below means value of the plasma's q-factor along its radius. q-factor at the plasma's core is in general different than q-factor at the plasma's edge, so q-profile is plasma's q-factor along its radius. In general, the safety factor is q=m/n, where, m is oscillation in poloidal direction and n is oscillation in toroidal direction. When q is a rational number (number expressed as fraction of two integers m and n) and integers m and n have low values (e.g. value of m and n less than 3) the plasma will resonate and will develop an asymmetry. Often this asymmetry rotates around the torus and can be detected by the phase of the signals obtained from the sensors as an oscillation in time. Such an asymmetry can reduce the heat confinement of the plasma configuration.

A current in a magnetic field will experience a force (Lorentz force) that is proportional to the strength of the magnetic field and the magnitude of the current flowing perpendicular to the magnetic field vector. This can be expressed in a vector equation as:

$$\vec{F} = \vec{I} \times \vec{B} \tag{1}$$

Only if the current $\vec{I}$ is flowing parallel to the magnetic field $\vec{B}$ then it will not experience a Lorentz force $\vec{F}$.

When Lorentz force is applied to plasma (or any non-rigid body) it will accelerate the plasma until there is no longer a net force applied to it, at which point plasma is in equilibrium or force-free state. In the case of a CT (which is a self-magnetized plasma with internal currents and magnetic field) this equilibrium is the point at which the currents flow parallel to the magnetic field.

Therefore, there is a specific relative current profile at which the current and the magnetic field are in equilibrium everywhere and no portion of the plasma experiences forces. As used herein "current profile" means value of a current (as a function of radius) flowing in the system within a certain time period. In general magnetized plasma is characterized by a poloidal field and a poloidal current (current and the field are in the same direction) and a toroidal field and a toroidal current. The poloidal current generates the toroidal field and the toroidal current generates the poloidal field. If the plasma had a uniform temperature everywhere, plasma magnetic lifetime $\tau_{mag}$ would scale as:

$$\tau_{mag} \sim T_e^{3/2} \tag{2}$$

where $\underline{B}$ is an electron temperature. However the plasma does not have a uniform temperature which means the rate of current decay in the plasma edge (where the plasma is colder) is faster than in the plasma core. The magnetic lifetime of inhomogeneous plasma is described as:

$$\tau_{mag} \sim T_{core} T_{edge}^{1/2} \tag{3}$$

As the edge current decays, equilibrium is lost and the plasma is pushed around by magnetic forces. As the current in the edge dissipates away, current from the plasma core is transported to the edge, which saps the core current faster than what would have been predicted from a Spitzer resistivity (electrical resistivity that is based upon electron-ion collisions).

Therefore, in order to improve the plasma confinement it was suggested that an additional current be run in a flux conserving chamber in order to increase plasma's toroidal field and thus increase plasma's q-profile. Such additional current pulse or pulses are driven in the flux conserver and are triggered after the decay of a plasma formation current pulse. The additional current pulse is driven through the wall of the flux conserver and along a central rod (see central rod 14a of FIG. 1) that extends through the axis of the toroid. This additional current pulse(s) is called an axial current pulse and is defined herein as a current that runs through the wall and the central rod of a flux conserving chamber and which is triggered after the decay of the plasma formation current pulse.

Figure 2A:
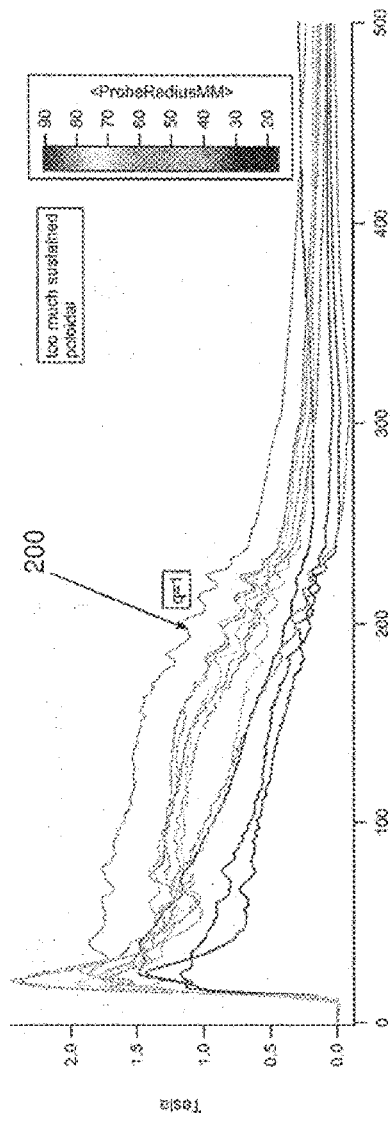
FIG. 2A is a graph showing plasma's poloidal magnetic field lines obtained from a number of probes when too much axial current is driven in the plasma confining system.
Figure 2B:
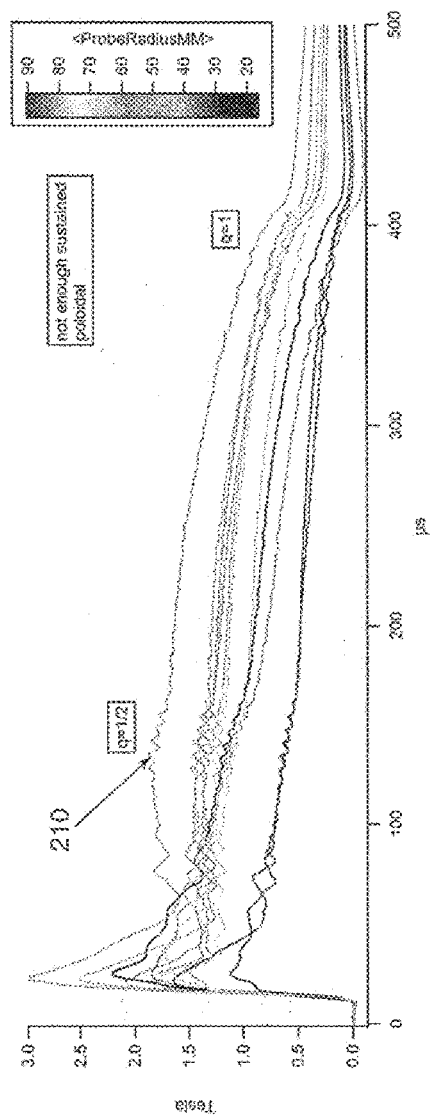
FIG. 2B is a graph showing plasma's poloidal magnetic field lines obtained from a number of probes when not enough axial current is driven in a plasma confining system.
Figure 4A:
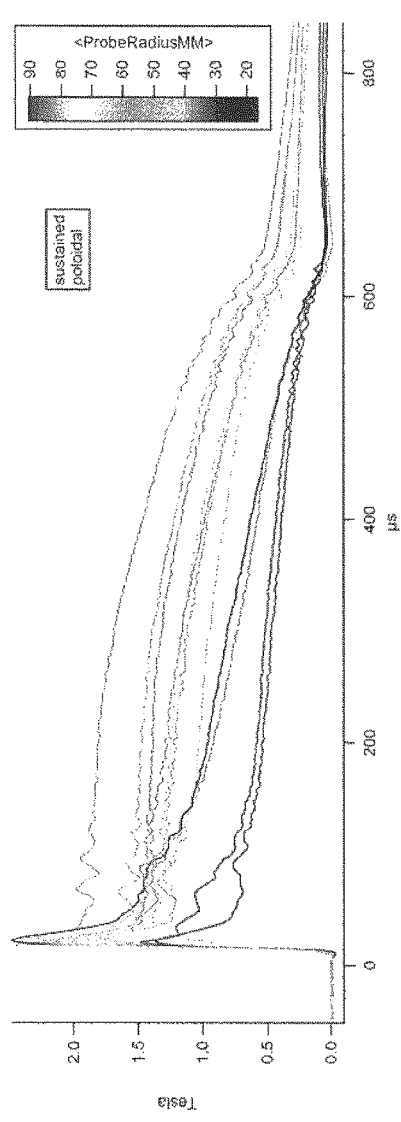
FIGS. 4A and 4B respectively show graphs of plasma's poloidal and toroidal magnetic field lines obtained from a number of probes when axial current is driven in a plasma confining system.

The confinement of plasma torus becomes unstable whenever a q-factor of the plasma reaches a rational number, such as ½, 1, 3/2, 2 etc. Experiments with certain prototypes of a plasma generator that are under construction at General Fusion, Inc. (Burnaby, Canada) show that the poloidal field decays with the decay of the plasma current while the toroidal field decreases with time constant L/R (inductance/resistance) of the plasma confinement system (e.g. plasma generator). Since the poloidal and toroidal magnetic fields decay at different rates, the q-factor goes up or down until it reaches a rational fraction, at which time plasma instability develops causing collapse of plasma confinement. FIG. 2A illustrates a graph of plasma's poloidal field over time obtained from different probes (one curve per probe) when too much axial current is driven in the flux conserver. As can be noticed by the graph in FIG. 2A, when too much current is driven in the flux conserver, the toroidal field increases and the q-profile can go up to for example 1 (in case the initial plasma's q-profile was between ½ and 1) causing swirling motion (oscillations 200) in the plasma resulting in destroyed flux surfaces, fast energy loss and shortening of plasma lifetime. So, when the poloidal field goes down faster (or the toroidal field increases faster than the decay of the poloidal field), the q-profile will increase and when reaches q rational number (i.e. q=1) the plasma becomes unstable (e.g. n=1 instability mode). This is so-called "over sustained" plasma. FIG. 2B illustrates a graph of plasma's poloidal field over time obtained from different probes (one curve per probe) when not enough axial current is driven in the flux conserver. When not enough axial current is driven in the flux conserver, the toroidal field drops faster than the poloidal field, and the q-profile will decrease and can hit q=½ (in case the initial plasma's q-profile was between ½ and 1) which can lead to plasma instability, shown as oscillations 210 (e.g. n=2 instability mode). This is so-called "under-sustained" plasma. As can been noticed from the graph, n=2 instability mode may not collapse the plasma (not as bad as n=1 mode) but, it shortens the life of the plasma which can be seen when compare graph of FIG. 2B to the graph of FIG. 4A that shows a magnetic field of sustained plasma (plasma that exist when one or more axial current pulses are driven in the flux conserver). As can been noticed the plasma's magnetic field lifetime in graph of FIG. 4A is much longer (n=2 instabilities are avoided) comparing with the plasma's magnetic field lifetime shown in FIG. 2B.

It is necessary to control and adjust plasma's q-factor within a desired range to keep the plasma stable. Fine tuning and adjustment of the plasma's q-profile can result in low plasma fluctuations and improved plasma confinement. Measuring plasma's q-profile and its control in real time is complex exercise requiring complex modeling. However, the inventors have found that the ratio of plasma's toroidal to the poloidal field can be used as a proxy for q-profile measurements. The ratio of the toroidal to poloidal field can be actively, and in real time, controlled and maintained to an empirically determined optimum value that relates to a predetermined q-value. This can be achieved, in one implementation, by adjusting the external current drive. For example, when the magnetic field ratio falls to some empirically determined value (e.g. q-factor approaches rational number, e.g. ½), the toroidal field can be increased by for example driving a poloidal current (axial current) in the flux conserving chamber, which will raise the magnetic field ratio up, keeping the plasma's q between critical values (½<q<1).

FIG. 1 schematically shows an example of a system 10 for generating and confining plasma having a plasma generator 12, a target chamber such as a flux conserver 14 and a power supply 22 having a formation power supply subsystem 22a and a sustainment power supply subsystem 22b. The flux conserver 14 comprises an axial, central, rod 14a. The power supply 22 can be a pulsed power supply comprising one or more capacitor banks for providing the formation pulse and one or more capacitor banks for providing additional power pulse, such as the axial current pulse(s) that flows through the central rod 14a and a wall of the flux conserver 14. In one implementation, the one or more capacitor banks that provide the formation pulse can provide the additional/axial current pulse as well. The generator 12 is configured to generate magnetized toroidal plasma, such as for example a spheromak or any other suitable magnetized plasma configuration. The generator 12 can include an outer electrode 16 and a coaxial inner electrode 15. The inner and the outer electrode 15 and 16 define an annular plasma formation channel 17 therein between. The plasma generator 12 can be, for example a one-stage Marshall gun or a two or more stages Marshall gun that can include acceleration section(s) in addition to the formation section to accelerate the formed plasma torus toward the flux conserver 14. FIG. 1 shows a one-stage Marshall gun with no acceleration section however a skilled person in the art would understand that the plasma generator 12 can be any other known plasma generator configured to generate and/or accelerate the plasma torus towards the flux conserver 14 without departing from the scope of the invention.

The generator 12 further comprises a series of magnetic coils 18 configured to provide a radial stuffing magnetic field for forming the plasma's poloidal field (see FIG. 2a). A power source (different from the power source 22) can be used to supply current to the coils 18. A pre-determined amount of gas is injected in the annular channel 17 through a ring of valves 20 that are located around the periphery of a generator's housing (only two valves 20 are shown in FIG. 1 and the rest are omitted for clarity). Each of the valves 20 are in fluid communication with a gas reservoir (not shown) and are operable to provide a substantially symmetrical introduction of gas into the formation channel 17. The injected gas can be for example, one or more isotopes of light elements i.e., isotopes of hydrogen (e.g., deuterium and/or tritium) and/or isotopes of helium (e.g., helium-3) or any other gas or gas mixture. Symmetrical introduction of the gas causes an annular cloud of gas to be formed in the channel 17. The system 10 may further be at least partially evacuated by using a pumping system connected to a pumping port 24. A number of viewing ports can be provided at various axial positions along the plasma generator 12 and/or flux conserver 14 to accommodate various measuring probes/detectors. An array of diagnostics can be provided to measure plasma's parameters (e.g. magnetic field, temperature, density, impurities) at various radial or axial positions, as well as system's parameters (e.g. current, voltage, etc.). Person skilled in the art would understand that any other configuration of plasma generator, coils or gas valves can be used without departing from the scope of the invention.

The coils 18 setup the stuffing magnetic field prior to the gas being injected into the annular channel 17 and prior to the current being discharged between the electrodes 15 and 16. For example, the stuffing magnetic field can be applied a few seconds before the discharge. Once the gas has diffused to at least partially fill the formation channel 17, the formation subsystem 22a of the power source 22 (e.g., the formation capacitor bank) can be triggered causing a formation current pulse to flow between the electrodes 15 and 16. The current passes through the gas in a substantially radial direction, ionizing the gas and forming the plasma. This current can create a toroidal magnetic field in the plasma, and the gradient of the magnetic pressure can exert a force (Lorentz force) $\vec{J} \times \vec{B}$ that can cause motion of the plasma down the annular channel 17 toward the flux conserver 14. As the plasma moves toward the flux conserver 14, it interacts with the stuffing magnetic field generated by the coils 18. The force that displaces the plasma toward the flux conserver 14 has sufficient strength to overcome the tension force of the stuffing magnetic field so that the stuffing field is weakened and deformed by the advancing plasma (bubbling stage). Eventually the plasma breaks free so that the magnetic field can wrap around the plasma forming a magnetized plasma torus with a poloidal magnetic field and a toroidal magnetic field. Once the generator 12 (e.g. the plasma gun) ceases to inject toroidal flux, the magnetic fields in the plasma quickly self-organize to form the plasma torus, e.g. spheromak.

After the formation pulse decays, the sustainment subsystem 22b (sustainment capacitor bank) of the source 22 can be triggered to provide the additional current pulse or pulses so that the current continue flowing in the flux conserver 14 (axial rod 14a and the wall of the chamber 14). Such additional, axial, current pulse is at a reduced level comparing to the initial, formation, pulse. For example, the formation current pulse can be about 500-900 kA for about 10-40 µs. The additional current pulse can be about 150-250 kA and it can be designed to decay with a L/R (inductance/resistance) time constant of about 100 µs-5 ms depending on the system's parameters. A person skilled in the art would understand that different values for currents or L/R timescales can be provided without departing from the scope of the invention. The L/R timescales can be changed by suitably selecting L and/or R, for example, by selecting the resistance R for a given value of the inductance L of the system 10.

Figure 3A:
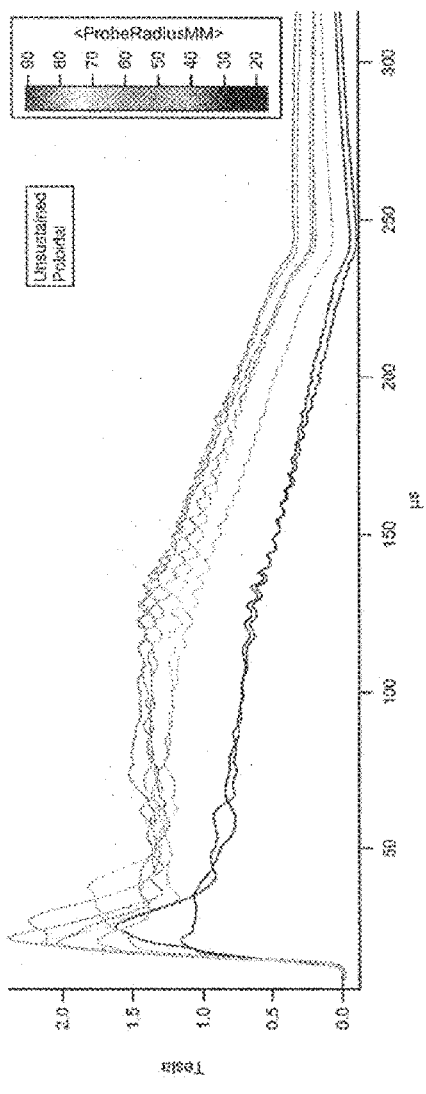
FIGS. 3A and 3B respectively show graphs of plasma's poloidal and toroidal magnetic field lines obtained from a number of probes when axial current is not driven in a plasma confining system.
Figure 3B:
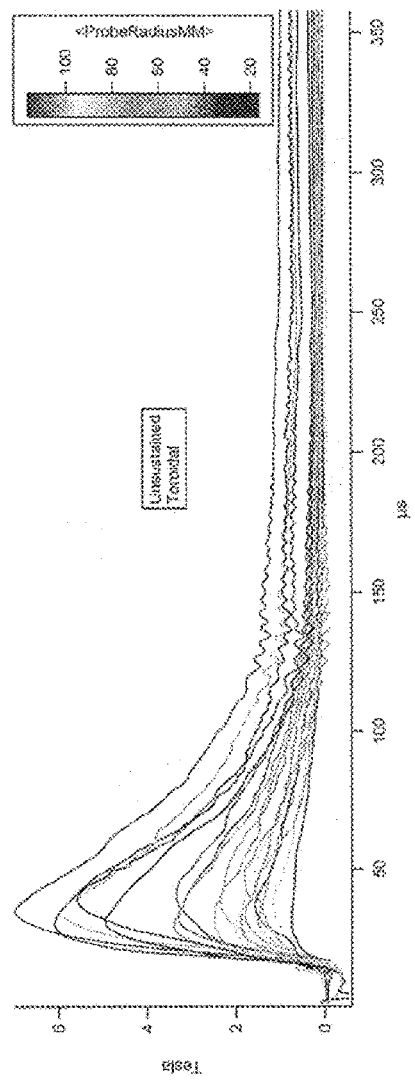
Figure 4B:
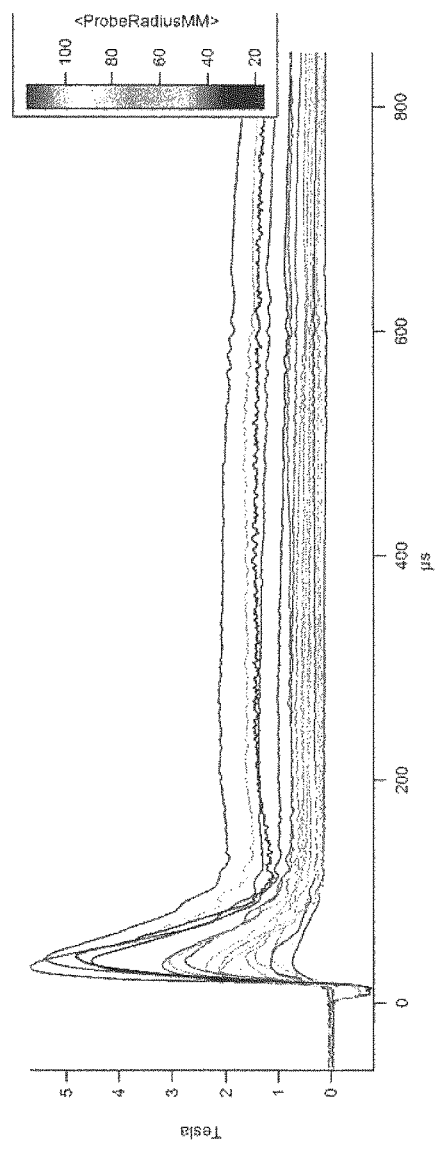

FIG. 3A illustrates examples of a poloidal field of the plasma, obtained in the experiments conducted in General Fusion Inc., when no additional, axial, current is driven in the flux conserver 14, and FIG. 4A illustrates the poloidal field when additional (axial) current is driven in the flux conserver 14. FIG. 3B and FIG. 4B illustrate the toroidal field of such unsustained plasma and sustained plasma, respectively. As can be noticed when no additional, axial current pulse is provided, the magnetic field of the plasma lasts at most about 200 µs (see FIG. 3A) where with the additional, axial, current pulse(s) (see FIG. 4A) the plasma lives much longer (e.g. about 600 µs). As shown in FIG. 4A, when the additional axial current pulse is triggered in addition to the formation pulse, the plasma torus experiences some turbulence at the beginning during formation period but after this initial turbulence it becomes very calm (stable) until turbulence develops at 600 µs that terminates the discharge and the plasma.

Figure 5:
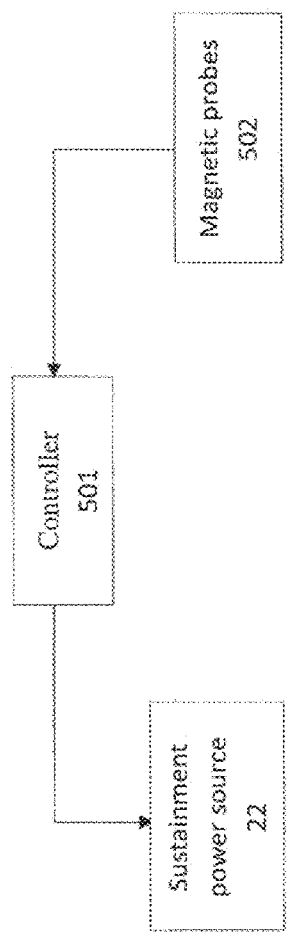
FIG. 5 is a schematic view of a controller for controlling and adjusting plasma's toroidal magnetic field.
Figure 6A:
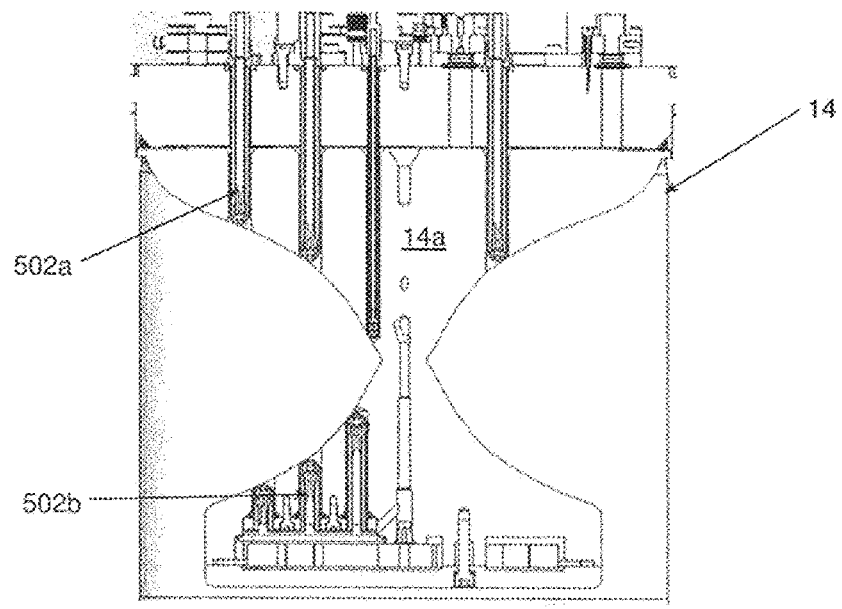
FIG. 6A is a side cross-sectional view of an example of a flux conserver showing a number of measuring probes at various radial position.
Figure 6B:
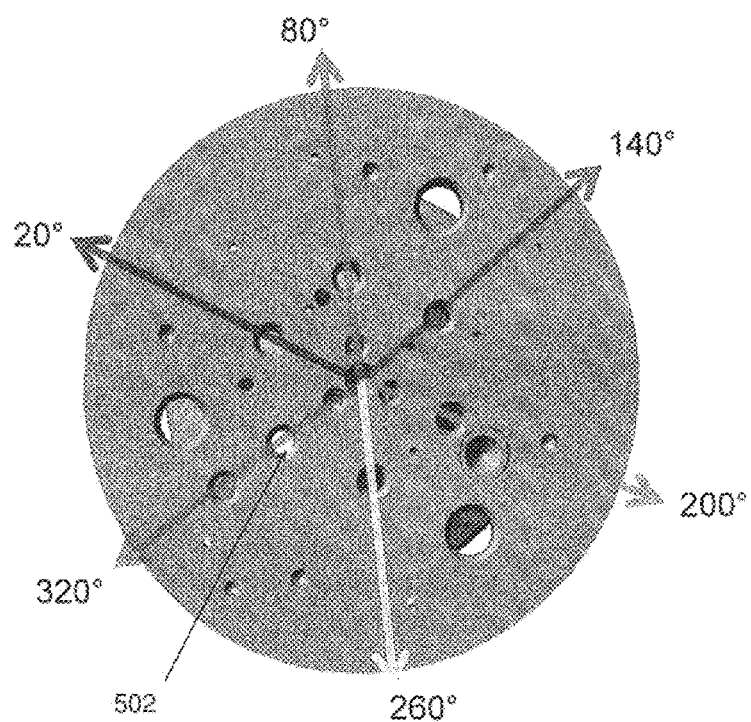
FIG. 6B is a top view of the flux conserver of FIG. 6A showing radial and angular position of a number of measuring probes.
Figure 7:
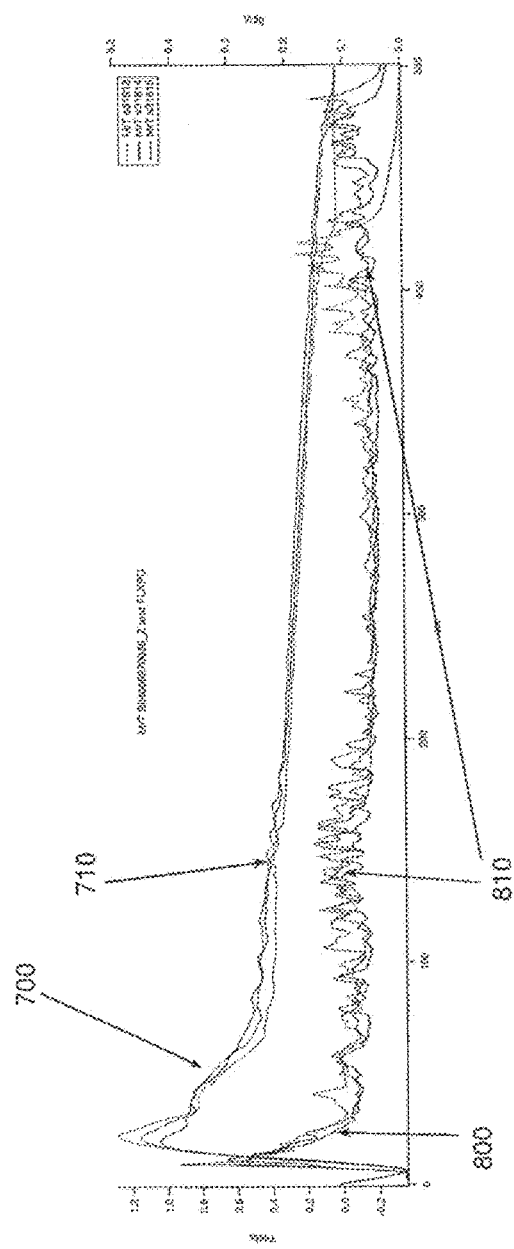
FIG. 7 is a graph showing a signal obtained from visible light photosensor and its correlation to plasma magnetic field.

During plasma stabilization/relaxation period, plasma's q will rise or fall depending on whether toroidal or poloidal field decays faster. Normally, poloidal field (from toroidal current in the plasma) decays faster than toroidal field, which can be maintained by the axial current. By reducing the inductance such that q falls during stabilization, one can use the axial current discharge to keep the q away from rational number values. In order to actively control the additional, axial, current pulse to keep the plasma stable for a longer time, a controller 501 (see FIG. 5) has been provided. Since the rate of decay of the poloidal field changes from shot to shot (it decays with the decay of the plasma current), the toroidal field needs to be controlled and adjusted to match the poloidal decay rate, so that the plasma's q-profile can be kept approximately constant, at value different than rational fraction, such as for example between ½ and 1 (½<q<1). The controller 501 includes an input unit, an output unit and a processing unit and can be located remotely from the system 10. The controller 501 is in communication with a number of probes 502. The probes 502 can provide signals of the parameters of the plasma over time. For example the probes 502 can be magnetic probes (e.g. B-dot probes or any other suitable magnetic probes) that can be positioned in the wall of the flux conserver 14 and/or the plasma gun 12 and can be configured to provide signals of the poloidal and toroidal field in the plasma. The magnetic probes can provide data of the plasma's magnetic field (poloidal and toroidal component) at various axial/radial and/or angular positions over time. FIG. 6A illustrates an example of the flux conserver 14 showing a number of probes 502a positioned at a upper portion of the flux conserver 14 (upper portion of the rod 14a) and a number of probes 502b positioned at a lower portion of the flux conserver 14 (lower portion of the rod 14a). The probes 502a and 502b can be magnetic probes and each of such probes can provide one signal for plasma's poloidal field and another signal for plasma's toroidal field. For example, each of the probes 502a, 502b can comprise two separate coils located near probe's tip. One of the coils can be oriented so that it will capture the signal of plasma's poloidal field and the other coil can be directed to measure plasma's toroidal field. Each of the probes 502a, 502b has a different radial, axial and/or angular position so that the magnetic field at various radial, axial and/or angular positions in the plasma can be measured over time. Based on the signals from various probes at various radial/angular positions, plasma's poloidal and toroidal field lines can be modeled and plasma's q-profile can be extrapolated. FIG. 6B shows positions of the probes at various angles. Person skilled in the art would understand that the number of probes and their position can vary without departing from the scope of the invention. In one implementation, probes 502 can be current or voltage measuring probes that can provide signals of plasma poloidal and toroidal currents. In another embodiment, the probes 502 can be interferometer, x-ray photodiode, an image detecting sensor or any other sensors that can provide information of plasma parameters. For example, FIG. 7 illustrates an example of the signal obtained from visible light sensor (i.e. optical fiber) that detects light radiating from the plasma and its correlation to plasma's magnetic field. As can been noticed when plasma experience some turbulence/instabilities, depicted as oscillations 710 in the magnetic field signal 700, the visible light signal 800 shows activities (oscillations 810) as well. Therefore, the controller 501 can receive as an input signals from sensors other than the magnetic probes and can process such signals to detect any irregularities (or oscillations) in such signals. In one implementation, the controller 501 can be fed with signals from all sensors used in the system 10.

The signals from the probes 502 are fed into the controller 501 as an input through the input unit. In one implementation, the controller 501 can comprise a memory with program code stored thereon that is executable by the processing unit to process the signals and estimate in real-time a ratio of toroidal to poloidal field at each position and/or an average ratio value. Experimentally, for a predefined parameters of the system 10, it was found an optimum threshold range of the ratio for which the extrapolated q-profile of the plasma is maintained between rational values (e.g. between ½ and 1). Such experimentally found optimal value (optimal range) is inputted in the controller 501, so that the controller 501 can compare the magnetic field ratio calculated based on the signals from the probes and the threshold value. If the measured signal of the magnetic field ratio is close to or below a lower value of the optimal empirical threshold value, the controller 501 sends an output signal to the power source 22 to trigger one or more of the sustainment capacitor banks 22b to trigger the axial current pulse to bring the toroidal field up thus keep the magnetic field ratio constant within the empirically found optimal range.

In one implementation of the system 10, the sustainment subsystem 22b of the power supply 22 is provided with an inductor and/or a crow-bar diode(s) arrangement 26 (see FIG. 1) to adjust inductance to resistance (L/R) time constant and to provide circulating axial current in the wall of the flux conserver 14 and the central rod 14a. The current can be adjusted to decay with a time constant L/R. This can be done by adjusting the inductor and/or the diodes 26. If the time constant L/R is set up too long, then the toroidal field decays slower than the poloidal field and the plasma's magnetic field ratio will go upwards leading to plasma turbulence (n=1 instability mode). If the time constant L/R is set up too short, the toroidal field will decay faster than the poloidal field and the magnetic field ratio goes downward leading again to plasma turbulence (n=2 instability mode). In order to have a servo control of the current pulse the time constant L/R need to be set up to be shorter than the shortest decay time of the poloidal field, such that the ratio of the toroidal to poloidal magnetic fields can drift downward. For example, for plasma with a magnetic life between 250-300 µs, the L/R time constant can be set up at about 200 µs. Instead of firing all of the capacitors of the sustainment bank at the same time, several capacitors are kept in reserve. When the controller 501 indicates that the estimated ratio drops below an empirically derived threshold, it can send a signal to the power source 22 to trigger another capacitor from the sustainment bank 22b to boost the poloidal current (toroidal field), and therefore bring the ratio of the magnetic fields up. For example, when the ratio of the toroidal to poloidal field drops below 0.6, the controller 501 triggers the power source 22 to bring the magnetic field ratio up. However, the additional (axial) current pulses triggered to control the magnetic field ratio are set up so that the ratio never exceeds the upper threshold of for example 0.9. A person skilled in the art would understand that the value of the L/R time constant and lower and upper threshold values can be different, depending on plasma configurations and thus plasma's q-profile within which one wants to maintain such plasma, without departing from the scope of the invention. In this way, the ratio of the magnetic fields (and indirectly q-profile of the plasma) can be maintained within the optimal threshold window regardless of the decay rate of the poloidal field.

When the plasma torus goes unstable at q=½, the instability shows up with an n=2 mode and can be determined by the phase of the signals obtained from the probes 502 positioned at different angular positions to each other which will show correlated instability. When the plasma torus goes unstable at q=1, the instability shows an n=1 mode and can be determined by the phase of the signals from the probes 502 positioned at different angular positions which will show the instability with anti-correlation.

In one implementation, the processing unit can execute program code that processes the signals from the probes 502, such as the magnetic probes, interferometers, x-ray photodiodes, visible light detector or any other sensor to detect any oscillations in the signals (i.e. oscillations 200, 210 in FIGS. 2A, 2B or oscillations 710, 810 in FIG. 7). These oscillations can indicate instabilities in the plasma caused by too little toroidal magnetic field. When the controller detects oscillations in the signals from one or multiple probes it triggers the power source 22 to provide additional current pulse to increase the toroidal field of the plasma. In one embodiment, the controller can comprise memory with program code stored thereon executable by the processing unit to calculate an instability mode of the plasma based on the oscillations' phase in the signals obtained from different probes at different angular position around the flux conserver 14. For example, if the identified oscillations indicate instability mode 2 (q=½) the additional axial current pulse is triggered to increase the toroidal field of the plasma and bring plasma's q up above ½. In case the identified instability mode is n=1 the controller doesn't trigger the power source but can adjust the L/R time constant. In another implementation, the controller 501 can comprise program code executable by the processing unit that can process the signals obtained from the x-ray probes and when the signal drops down indicating plasma cooling, the controller 501 can send a signal to the power source 22 to trigger the additional axial current pulse. In one embodiment, the processing unit can execute program code that can process any and all signals from any or all probes and can make a decision to trigger additional poloidal current in the chamber 14 if a signal from at least one of the probes indicates development of plasma instabilities.

Embodiments of a plasma generation system with a controller for controlling a decay time of plasma magnetic field are disclosed. Any of such embodiments can be used for generation of high energy density plasma suited for applications in neutron generators, nuclear fusion, nuclear waste remediation, generation of medical nucleotides, for materials research, for remote imaging of the internal structure of objects via neutron radiography and tomography, x-rays generator, etc.

While particular elements, embodiments and applications of the present disclosure have been shown and described, it will be understood, that the scope of the disclosure is not limited thereto, since modifications can be made without departing from the scope of the present disclosure, particularly in light of the foregoing teachings. Thus, for example, in any method or process disclosed herein, the acts or operations making up the method/process may be performed in any suitable sequence and are not necessarily limited to any particular disclosed sequence. Elements and components can be configured or arranged differently, combined, and/or eliminated in various embodiments. The various features and processes described above may be used independently of one another, or may be combined in various ways. All possible combinations and sub-combinations are intended to fall within the scope of this disclosure. Reference throughout this disclosure to "some embodiments," "an embodiment," or the like, means that a particular feature, structure, step, process, or characteristic described in connection with the embodiment is included in at least one embodiment. Thus, appearances of the phrases "in some embodiments," "in an embodiment," or the like, throughout this disclosure are not necessarily all referring to the same embodiment and may refer to one or more of the same or different embodiments. Indeed, the novel methods and systems described herein may be embodied in a variety of other forms; furthermore, various omissions, additions, substitutions, equivalents, rearrangements, and changes in the form of the embodiments described herein may be made without departing from the spirit of the inventions described herein.

Various aspects and advantages of the embodiments have been described where appropriate. It is to be understood that not necessarily all such aspects or advantages may be achieved in accordance with any particular embodiment. Thus, for example, it should be recognized that the various embodiments may be carried out in a manner that achieves or optimizes one advantage or group of advantages as taught herein without necessarily achieving other aspects or advantages as may be taught or suggested herein.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without operator input or prompting, whether these features, elements and/or steps are included or are to be performed in any particular embodiment. No single feature or group of features is required for or indispensable to any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Conjunctive language such as the phrase "at least one of X, Y and Z," unless specifically stated otherwise, is otherwise understood with the context as used in general to convey that an item, term, etc. may be either X, Y or Z. Thus, such conjunctive language is not generally intended to imply that certain embodiments require at least one of X, at least one of Y and at least one of Z to each be present.

The example calculations, simulations, results, graphs, values, and parameters of the embodiments described herein are intended to illustrate and not to limit the disclosed embodiments. Other embodiments can be configured and/or operated differently than the illustrative examples described herein. Indeed, the novel methods and apparatus described herein may be embodied in a variety of other forms; furthermore, various omissions, substitutions and changes in the form of the methods and systems described herein may be made without departing from the spirit of the inventions disclosed herein.

What is claimed is:

1. A system for controlling magnetic lifetime of a magnetized plasma, the system comprising:
   a controller comprising an input unit, a processing unit and an output unit;
   a plurality of measuring probes positioned at various radial, axial and angular positions, each of the plurality of measuring probes configured to provide signals of at least one parameter of the plasma to the input unit of the controller; and
   a power source in communication with the output unit of the controller, the power source configured to provide one or more additional current pulses to the system to increase a toroidal magnetic field of the plasma, and having means for adjusting an inductance-to-resistance (L/R) time constant of the power source to adjust a current decay of the current pulses,
   the controller having a memory comprising program code executable by the processing unit to process the signals obtained from the plurality of measuring probes to detect an irregularity in the obtained signals and trigger the power source to provide an additional current pulse based on a detected irregularity in the signal of at least one probe,
   wherein the L/R time constant of the power source is adjusted to be shorter than a shortest decay time of a poloidal field of the plasma.

2. The system of claim 1, wherein the means for adjusting the L/R time constant is an inductor.

3. The system of claim 1, wherein the controller further comprises program code executable by the processing unit to further calculate a ratio of the toroidal to poloidal magnetic field of the plasma, compare the calculated ratio to an empirically derived lower threshold value and trigger the power source to provide the additional current pulse when the calculated ratio is below the lower threshold value.

4. The system of claim 3, wherein the controller further comprises program code executable by the processing unit to maintain the toroidal to poloidal magnetic field ratio between the lower threshold value and an upper threshold value.

5. The system of claim 1, wherein the controller further comprises program code executable by the processing unit to further detect any oscillations in any signals obtained from the plurality of measuring probes, the additional current pulse being triggered when oscillations are detected in a signal obtained from at least one of the probes.

6. The system of claim 5, wherein the controller further comprises program code executable by the processing unit to calculate an instability mode of the plasma based on a phase of the oscillations in the signals obtained from the probes positioned at different angular positions, the program code further executable to adjust timing of the triggering of the additional current pulse based on the calculated instability mode.

7. A method for controlling a magnetic lifetime of a magnetized plasma, the method comprising:
   adjusting an inductance to resistance (L/R) time constant of a power source to be shorter than a shortest decay time of a poloidal field of the magnetized plasma;
   measuring one or more parameters of the plasma by a plurality of probes positioned at various radial, axial and angular positions in a wall of a flux conserving chamber to detect the parameters at various position from a magnetic axis of the plasma;
   processing signals obtained from the plurality of probes and detecting an irregularity in the obtained signals; and
   triggering the power source to provide an additional current pulse based on a detected irregularity in a signal of at least one probe.

8. The method of claim 7, wherein the method further comprises calculating a ratio of toroidal to poloidal magnetic field of the plasma, comparing the calculated ratio to an empirically derived lower threshold value and triggering the power source to provide the additional current pulse when the calculated ratio is below the empirically derived lower threshold value.

9. The method of claim 7, wherein the method further comprises detecting whether any oscillations are present in the signals obtained from the probes and triggering the additional current pulse when oscillations are detected.

10. The method of claim 9, wherein the method further comprises calculating an instability mode of the plasma based on a phase of the oscillations in the signals from the probes positioned at different angular position, and adjusting a timing of the triggering of the additional current pulse based on the calculated instability mode.

* * * * *